United States Patent [19]

Gumbert

[11] Patent Number: 5,005,814
[45] Date of Patent: Apr. 9, 1991

[54] PRODUCT CARRIER FOR CIRCUIT BOARDS

[75] Inventor: Hans Gumbert, Sinn, Fed. Rep. of Germany

[73] Assignee: U.S. Philips Corporation, New York, N.Y.

[21] Appl. No.: 890,789

[22] Filed: Jul. 23, 1986

Related U.S. Application Data

[63] Continuation of Ser. No. 713,226, Apr. 18, 1985, abandoned.

[30] Foreign Application Priority Data

Mar. 20, 1984 [DE] Fed. Rep. of Germany ....... 3410130

[51] Int. Cl.$^5$ ................................................. B23A 3/00
[52] U.S. Cl. .................................... 269/309; 269/310; 269/900; 269/903
[58] Field of Search .................... 269/47, 50, 70, 296, 269/309, 310, 900, 903

[56] References Cited

U.S. PATENT DOCUMENTS

| | | | |
|---|---|---|---|
| 3,559,980 | 2/1971 | Terai | 269/309 |
| 3,606,300 | 9/1971 | Davis | 269/309 |
| 3,853,313 | 12/1974 | Appenzeller et al. | 269/21 |
| 4,292,116 | 9/1981 | Takahashi et al. | 29/757 |
| 4,522,330 | 7/1985 | Kerrey et al. | 269/309 |

Primary Examiner—J. J. Hartman
Attorney, Agent, or Firm—Robert T. Mayer

[57] ABSTRACT

The invention relates to a product carrier for circuit boards (23), which are subjected on this carrier to an operation, more particularly to a component mounting operation. The circuit boards (23) are provided for this purpose with location holes (21), into which location pins (5) engage, which can be arranged on the base plate (1) of the carrier in order to fix the circuit board (23) on the product carrier in a given position and at a given height with respect to the base plate (1). The location pins (5) are arranged on the base plate (1) so that they can be individually lowered. Between the location pins (5) there are provided mounting areas (27) for supporting pins (29), from which these pins (29) extend vertically up to the lower side (35) of the circuit board (23) between components which may already be provided at said side to additionally define a supporting plane (37).

11 Claims, 2 Drawing Sheets

PRODUCT CARRIER FOR CIRCUIT BOARDS

This is a continuation of application Ser. No. 713,226, filed Mar. 18, 1985, now abandoned.

The invention relates to a product carrier for circuit boards, which are subjected on this carrier to an operation, more particularly to a component mounting operation, the circuit boards being provided with location holes into which location pins engage, which are provided on the base plate of the carrier to fix the circuit board on the product carrier in a given position at a given height with respect to the base plate.

Circuit boards arranged on the product carrier are fixed by the location pins above the base plate in an operation plane. The product carriers are arranged on transport equipments and move with the circuit boards thereon to different operation positions. It is known from U.S. Pat. No. 4,292,116 to provide the location pins on a component mounting device. The circuit board moved by a transport equipment to the operation position is aligned in said position in that location pins penetrate into location holes of the circuit board. This operating method is comparatively inaccurate because for a perfect mounting operation tolerances between the location holes of the circuit board and the location pins are impermissible. An alignment of the circuit board by means of location pins which move into them in the machining position requires certain tolerances to be admitted for a disturbance-free operation.

Therefore, product carriers provided with a base plate and location pins thereon are more favourable because thus outside the operating position the circuit boards can be mounted without tolerances and in a reliable manner.

If, for example, the product carrier is used for the placement of surface mounted devices on circuit boards, it is found that due to the high performance of the available placement machines the circuit board types have to be exchanged relatively frequently. The exchange of a circuit board type makes it necessary, however, to arrange the location pins also in a different manner. This can be effected by rescrewing. However, a rescrewing operation is time-consuming and the flexibility with respect to the displacement of the location pins is limited. Moreover, the circuit boards may be excessively subjected to bending force during the component mounting operation when larger circuit boards are supported only at the corners.

The invention has for its object to provide a product carrier which can be readjusted for another circuit baord type without great technical difficulty within a short time and with a few manipulations.

According to the invention, this object is achieved in that the location pins are arranged on the base plate so that they can individually be lowered and that there are provided between said location pins mounting areas for supporting pins, within which the supporting pins can be arranged in positions, from which these pins extend vertically up to the lower side of the circuit board, between components which may already be provided at said side of the circuit board to additionally define a supporting plane.

The location pins are then arranged so that they always engage at the edge of the circuit board into location holes provided there, it being sufficient that the circuit board is supported by two location pins. The other location pins which do not correspond to the arrangement of the location holes of the circuit board are simply lowered. The circuit board is further supported by the supporting pins, which can be arranged in a large number of positions within the mounting areas. Thus, a sufficient number of supporting points in a sufficient number of positions can be found.

The mounting areas can be formed differently. According to an advantageous embodiment of the invention the mounting areas are defined by bores in the base plate, into which the supporting pins can be inverted. The bores preferably extend in the form of a grating of holes over the base plate.

During operation, for example, particles crumbled off circuit boards or other contaminations may fall into the bores so that the latter are more or less clogged. In order to avoid this, according to a further embodiment of the invention foot pins are inserted into the bores the supporting pins being mounted onto said foot pins by means of a mounting sleeve provided at there feet. Thus, it is always ensured that the upper sides of the supporting pins are located accurately in the supporting plane.

According to a further embodiment of the invention the location pins are arranged in vertical guiding ducts of supporting blocks, which are detachably secured on the base plate, and that locking pins can be inserted into recesses of the location pins transverse to the guiding ducts, which locking pins engage into said recesses in the lifted position of the location pins. Consequently, when the locking pins are inserted or pulled out, the location pins can be brought into the supporting plane or be lowered beneath the supporting plane.

In order to define the supporting plane, according to a further embodiment of the invention, the location pins are provided at their end facing the circuit board with a bearing surface, from the center of which projects a location peg, which engages into a location hole of the circuit board. The bearing surfaces of the location pins lie in the supporting plane in the lifted position of the pins.

In order that the invention may be readily carried out, it will now be described morefully with reference to the accompanying drawing, in which.

Figure 1:
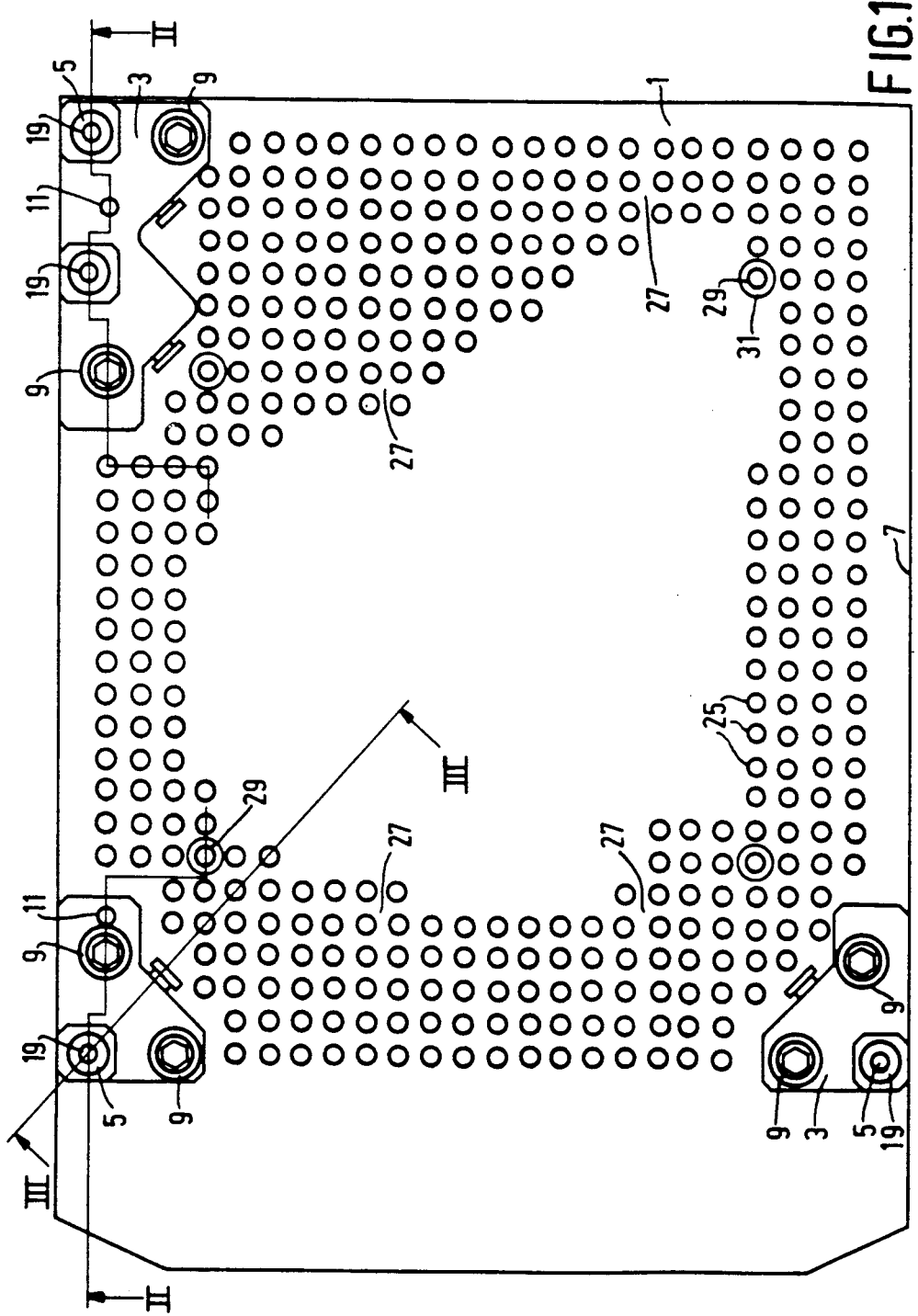
FIG. 1 is a plan view of a product carrier suitable for a rapid re-adjustment.

The product carrier shown in FIG. 1 comprises a base plate 1, onto which are screwed supporting blocks 3 for location pins 5. The supporting blocks 3 are situated at the edge 7 of the base plate. In the embodiment shown in the drawing, three supporting blocks 3 are present, one of which is provided with two location pins 5.

Between the supporting blocks 3 and hence also between the location pins 5, bores 8 are provided, into which supporting pins 29, can be inserted, directly or indirectly. The bores extend in the form of a grating substantially over the whole base plate and its part free from supporting blocks, respectively.

Figure 2:
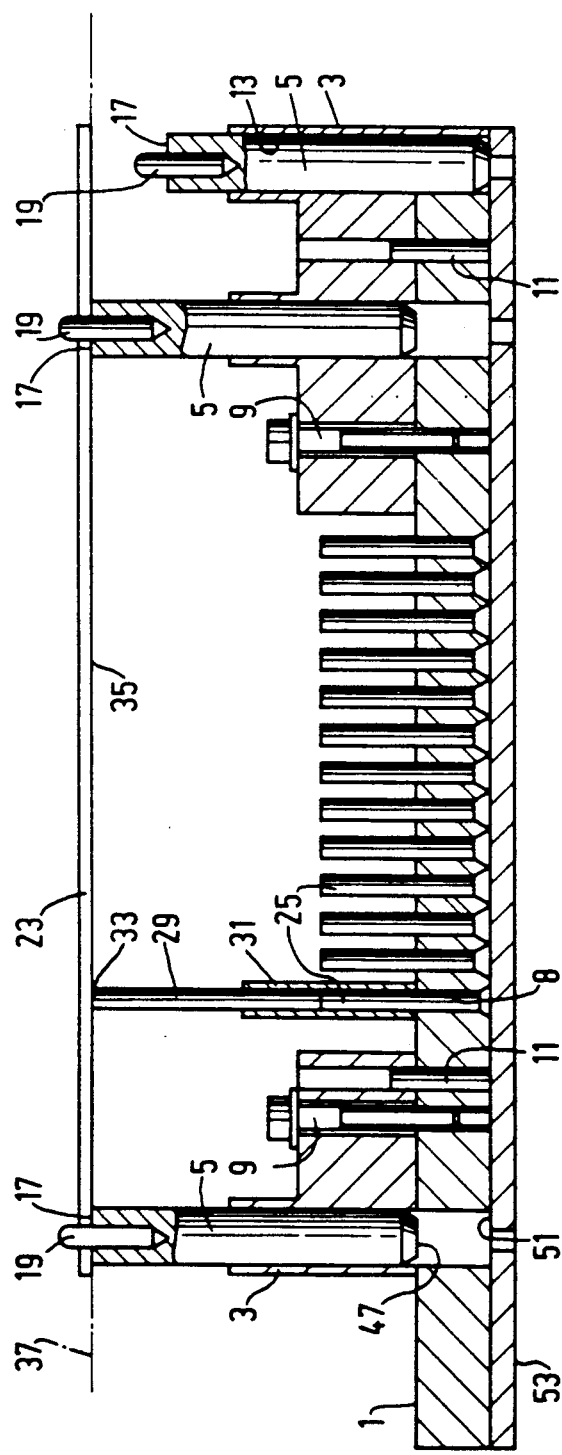
FIG. 2 is a sectional view of the product carrier supporting a circuit board taken on the line II—II in FIG. 1.

FIG. 2 shows a sectional view of the base plate 1 taken on the line II—II of FIG. 1. The location blocks 3 are screwed to the base plate 1 by means of screws 9. The alignment of the supporting blocks is effected by means of connection pins 11, which extend from the base plate 1 into the location blocks 3.

The location blocks 3 are provided with vertical guiding ducts 13, in which the location pins 5 can be displaced up and down. The location pins 5 are provided at their end facing the circuit board 23 with a bearing surface 17, from the centre of each of which projects a location peg 19, which engages into a location hole 21 of the circuit board 23.

Foot pins 25 are inserted into the bores 8 of the base plate 1 and such foot pins 25 are present in all the bores 8 of the mounting areas 27. The supporting pins 29 can be mounted on the foot pins 25. These supporting pins 29 have the diameter of the foot pins 25 and they are provided at their foot ends with a mounting sleeve 31, which can be mounted onto the desired foot pin 25. The upper face 33 of the supporting pin 29 is then located accurately at the lower face 35 of the circuit board 23. The bearing surfaces 17 of the upright location pins 5 and the upper faces 33 of the supporting pins 25 fall into the supporting plane 37, on which the circuit board 23 is located in flat condition. As many supporting pins 29 are used as are required to support the circuit board 23 in addition to the support by the location pins 5 in a reliable manner. Since a large variation possibility is given in mounting the supporting pins 29, the supporting pins 29 can be arranged with the lower side 35 of the circuit board already equipped with components so that they always abut between already present components against the lower face 35 of the circuit board.

Figure 3:
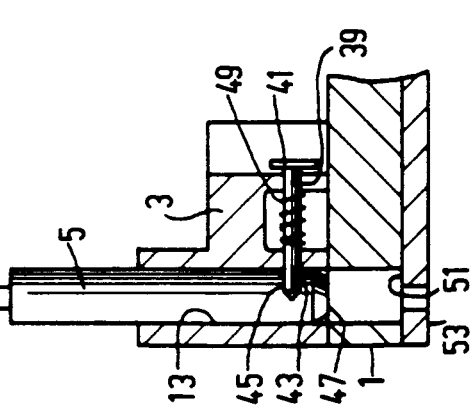
FIG. 3 is a sectional view of the product carrier taken on the line III—III of FIG. 1.

FIG. 3 shows with reference to the sectional view III—III of FIG. 1 the possibility of adjustment in height of the supporting pins 5. A locking pin 39 with a handle button 41 and a tip 43 extends through the supporting block 3 transverse to the guiding duct 13. The tip 43 engages into a recess 45 of the location pin 5 when the location pin 5 is lifted into the supporting position. By means of a spring 49, the locking pin 39 is constantly urged towards the guiding duct 13. In FIG. 3, the location pin 5 is shown in lifted position. This corresponds to the position in FIG. 2, in which the location pin 5 touches the lower face 35 of the circuit board 23. When the location pin 5 is located with its bottom surface 47 on the upper side 51 of a lower closure plate 53, the location pin 5 is in the lowered position. This lowered position is in FIG. 2 the position which is occupied by the location pin 5 shown on the extremely righthand side.

What is claimed is:

1. A product carrier for circuit boards which are subjected to an operation while on this carrier and which have locating holes for aligning the board with respect to the carrier, comprising
    a base plate, and
    a plurality of locating pins provided on the base plate for insertion in the locating holes to fix a circuit board on the carrier in a given position and at a given height with respect to said plate, and
    further comprising means for lowering the locating pins out of their locating holes individually with respect to the base plate,
    a plurality of mounting areas on said base plate between said locating pins, and
    a plurality of supporting pins between said locating pins and arranged in positions with respect to respective mounting areas, from which area these pins extend vertically up to the lower side of a circuit board carried on the carrier to support said board, said supporting pins defining a supporting plane and being arranged to extend to the lower side of the circuit board between any components which already have been mounted to said board.

2. A carrier as claimed in claim 1, characterized in that the mounting areas are defined by bores in the base plate, said supporting pins being inserted in said bores.

3. A carrier as claimed in claim 2, characterized in that said bores are arranged as a grating of holes over the base plate.

4. A carrier as claimed in claim 3, further comprising a plurality of foot pins and mounting sleeves, each of said supporting pins being mounted onto a foot pin by a mounting sleeve which engages a corresponding foot pin and support pin respectively.

5. A carrier as claimed in claim 4, further comprising
    a plurality of supporting blocks, detachably secured on the base plate, each of said supporting blocks having a vertical guiding duct, and a plurality of locking pins respectively inserted into recesses of the locating pins transverse to said guiding ducts, said locking pins engaging said recesses when said locating pins are in a lifted position.

6. A carrier as claimed in claim 5, characterized in that each of said locating pins has an end facing the circuit board and having a bearing surface, and in that the carrier comprises a plurality of locating pegs projecting from the center of respective bearing surfaces, for engaging respective locating holes in the circuit board.

7. A carrier as claimed in claim 5, characterized in that each of said locating pins has an end facing the circuit board and having a bearing surface, and in that the carrier comprises a corresponding plurality of locating pegs projecting from the center of respective bearing surfaces, for engaging respective locating holes in the circuit board.

8. A carrier as claimed in claim 1, further comprising
    a plurality of supporting blocks, detachably secured on the base plate, each of said supporting blocks having a vertical guiding duct, and
    a plurality of locking pins respectively inserted into recesses of the locating pins transverse to said guiding ducts, said locking pins engaging said recesses when said locating pins are in a lifted position.

9. A carrier as claimed in claim 1, characterized in that each of said locating pins has an end facing the circuit board and having a bearing surface, and in that the carrier comprises a plurality of locating pegs projecting from the center of respective bearing surfaces, for engaging respective locating holes in the circuit board.

10. A product carrier for circuit boards which are subjected to an operation while on this carrier and which have locating holes for aligning the board with respect to the carrier, comprising
    a base plate, and
    a first plurality of locating pins provided on the base plate for insertion in the locating holes to fix a circuit board on the carrier in a given position and at a given height with respect to said plate, and
    further comprising means for lowering the locating pins out of their locating holes individually with respect to the base plate,
    a second plurality of mounting areas on said base plate between said locating pins, each mounting area being defined by a bore, a corresponding second plurality of foot pins inserted in said bores, a third plurality of mounting sleeves, and a corresponding third plurality of supporting pins between said locating pins and arranged in positions with respect to respective mounting areas, from which area these pins extend vertically up to the lower side of a circuit board carried on the carrier to support said board, said supporting pins defining a supporting plane and being arranged to extend to the lower side of the circuit board between any components which already have been mounted to said board, each supporting pin being mounted onto one of said foot pins by a respective mounting sleeve.

11. A carrier as claimed in claim 10, further comprising a plurality of supporting blocks, detachably secured on the base plate, each of said supporting blocks having a vertical guiding duct, and a plurality of locking pins respectively inserted into recesses of the locating pins transverse to said guiding ducts, said locking pins engaging said recesses when said locating pins are in a lifted position.

* * * * *